(12) United States Patent
Patrick

(10) Patent No.: US 7,829,368 B2
(45) Date of Patent: Nov. 9, 2010

(54) METHODS OF FORMING DOUBLE PINNED PHOTODIODES

(75) Inventor: Inna Patrick, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 66 days.

(21) Appl. No.: 12/389,973

(22) Filed: Feb. 20, 2009

(65) Prior Publication Data

US 2009/0162964 A1 Jun. 25, 2009

Related U.S. Application Data

(60) Continuation of application No. 11/543,824, filed on Oct. 6, 2006, now Pat. No. 7,510,900, which is a division of application No. 10/898,939, filed on Jul. 27, 2004, now Pat. No. 7,495,273, which is a continuation of application No. 10/400,389, filed on Mar. 28, 2003, now Pat. No. 6,921,934.

(51) Int. Cl.
*H01L 21/00* (2006.01)
(52) U.S. Cl. .................. 438/63; 438/78; 257/E21.003; 257/E21.537
(58) Field of Classification Search .................. 438/63, 438/78; 257/E21.003, E21.537
See application file for complete search history.

(56) References Cited

U.S. PATENT DOCUMENTS

| | | |
|---|---|---|
| 6,026,964 A | 2/2000 | Hook et al. |
| 6,100,551 A | 8/2000 | Lee et al. |
| 6,194,702 B1 | 2/2001 | Hook et al. |
| 6,392,263 B1 | 5/2002 | Chen et al. |
| 6,489,643 B1 | 12/2002 | Lee et al. |
| 6,504,195 B2 | 1/2003 | Guidash |
| 6,512,280 B2 | 1/2003 | Chen et al. |
| 6,515,321 B1 | 2/2003 | Jwo |
| 6,706,550 B2 | 3/2004 | Lee et al. |
| 6,781,169 B2 | 8/2004 | Roy |
| 6,809,359 B2 | 10/2004 | Yamada |
| 6,921,934 B2 | 7/2005 | Patrick |
| 6,950,134 B2 | 9/2005 | Miida |
| 7,030,427 B2 | 4/2006 | Takamura |
| 7,132,705 B2 | 11/2006 | Kuwazawa |

(Continued)

FOREIGN PATENT DOCUMENTS

JP 59-198756 10/1984

(Continued)

*Primary Examiner*—Ngan Ngo
(74) *Attorney, Agent, or Firm*—Dickstein Shapiro LLP

(57) ABSTRACT

A pinned photodiode, which is a double pinned photodiode having increased electron capacitance, and a method for forming the same are disclosed. The invention provides a pinned photodiode structure comprising a substrate base over which is a first layer of semiconductor material. There is a base layer of a first conductivity type, wherein the base layer of a first conductivity type is the substrate base or is a doped layer over the substrate base. At least one doped region of a second conductivity type is below the surface of said first layer, and extends to form a first junction with the base layer. A doped surface layer of a first conductivity type is over the at least one region of a second conductivity type and forms a second junction with said at least one region of a second conductivity type.

26 Claims, 12 Drawing Sheets

U.S. PATENT DOCUMENTS

| | | |
|---|---|---|
| 2001/0032979 A1 | 10/2001 | Rhodes |
| 2001/0042875 A1 | 11/2001 | Yoshida |
| 2002/0024071 A1 | 2/2002 | Kawajiri et al. |
| 2002/0117699 A1 | 8/2002 | Francois |
| 2002/0140009 A1 | 10/2002 | Lee et al. |
| 2002/0167031 A1 | 11/2002 | Francois |
| 2002/0175355 A1 | 11/2002 | Shim |
| 2003/0030083 A1 | 2/2003 | Lee et al. |
| 2004/0061152 A1 | 4/2004 | Kashiura et al. |
| 2005/0230721 A1* | 10/2005 | Patrick ................. 257/292 |
| 2007/0031987 A1* | 2/2007 | Mouli et al. ............. 438/57 |

FOREIGN PATENT DOCUMENTS

| | | |
|---|---|---|
| JP | 02-294079 | 12/1990 |
| JP | 07-297444 | 11/1995 |
| JP | 2000-31525 A | 1/2000 |

* cited by examiner

METHODS OF FORMING DOUBLE PINNED PHOTODIODES

CROSS-REFERENCE TO RELATED APPLICATIONS

The present application is a continuation of application Ser. No. 11/543,824, filed Oct. 6, 2006, now U.S. Pat. No. 7,510,900 which is a divisional of application Ser. No. 10/898,939, filed Jul. 27, 2004, now U.S. Pat. No. 7,495,273 which is a continuation of application Ser. No. 10/400,389, filed Mar. 28, 2003 (now U.S. Pat. No. 6,921,934, issued Jul. 26, 2005), the entire disclosures of which are incorporated herein by reference.

FIELD OF THE INVENTION

The present invention relates to the field of semiconductor devices, particularly to improved photodiodes having greater charge capacity for use in imaging devices.

BACKGROUND OF THE INVENTION

CMOS imagers are increasingly being used as low cost imaging devices. A CMOS imager circuit includes a focal plane array of pixel cells. Each of the pixel cells includes a photosensitive element, such as a photodiode, photo gate, or photoconductor overlying a doped region of a substrate for accumulating photo-generated charge in an underlying portion of the substrate. A readout circuit is connected to each pixel cell and often includes a floating diffusion region for receiving charge from the photosensitive element, and a source follower transistor, which has a gate electrically connected to the floating diffusion region. The imager may also include at least one transistor for transferring charge from the photosensitive element to the floating diffusion region, and a transistor for resetting the floating diffusion region to a predetermined charge level prior to charge transfer. A row select access transistor is also typically used to gate a pixel output signal produced by the source follower transistor. The pixel cell above is often called a CMOS Active Pixel Sensor (APS) cell, which is used to collect light energy and convert it into a readable electrical signal.

A schematic top view of a portion of a semiconductor wafer fragment containing one exemplary CMOS APS cell is shown in FIG. 1. This CMOS APS cell 10 is a four transistor cell. As it will be described below, the CMOS APS cell 10 shown includes a photodiode 13 formed within a substrate. This photodiode 13 is formed as a pinned photodiode shown in FIG. 2. Alternatively, the CMOS APS cell 10 may include a photo gate, photoconductor or other photon to charge converting device, in lieu of a pinned photodiode 13, as the initial accumulating area for photo-generated charge. The photodiode 13 includes a p+ surface layer 5 and an underlying n− region 14.

The CMOS image sensor 10 of FIG. 1 has a transfer gate 7 for transferring photoelectric charges generated in the n− region 14 to a floating diffusion region (sensing node) 3. The floating diffusion region 3 is further connected to a gate 27 of a source follower transistor. The source follower transistor provides an output signal to a row select access transistor having gate 37 for selectively gating the output signal to terminal 33. A reset transistor having gate 17 resets the floating diffusion region 3 to a specified charge level before each charge transfer from the n− region 14 of the photodiode 13.

Referring to FIG. 2, pinned photodiode 13 is formed on a p+ substrate base 1, which is beneath a p− epitaxial layer 2 (or p-well surface layer). Typically, the substrate base is p-type and is beneath a p-type epitaxial layer. It is also possible, for example, to have a p-type substrate base beneath p-wells in an n-type epitaxial layer. The n− region 14 underlies the p+ region 5 at a depth in the epitaxial layer 2 above the substrate base 1. The n− region 14 and p+ region 5 of the photodiode 13 are spaced between an isolation region 9 and a charge transfer transistor gate 7. The pinned photodiode 13 has a p+/n−/p− structure.

The photodiode 13 has two p-type regions 5, 2 having a same potential so that the n− region 14 is fully depleted at a pinning voltage ($V_{pin}$). The pinned photodiode is termed "pinned" because the potential in the photodiode is pinned to a constant value, $V_{pin}$, when the photodiode is fully depleted. When the transfer gate 7 is operated, photo-generated charge is transferred from the charge accumulating region 14 to the floating diffusion region 3. A complete transfer of charge takes place when a voltage on the floating diffusion region 3 remains above $V_{pin}$ while the pinned photodiode functions at a voltage below $V_{pin}$. An incomplete transfer of charge results in image lag.

The isolation region 9 is typically formed using a conventional shallow trench isolation (STI) process or by using a Local Oxidation of Silicon (LOCOS) process. The floating diffusion region 3 adjacent to the transfer gate 7 is commonly n-type. A translucent or transparent insulating layer (not shown) may also be formed over the CMOS APS cell 10.

Additionally, impurity doped source/drain regions 32 (FIG. 1), having n-type conductivity, are provided on either side of the transistor gates 17, 27, 37. Conventional processing methods are used to form, for example, contacts 32 (FIG. 1) in an insulating layer to provide an electrical connection to the source/drain regions 32, the floating diffusion region 3, and other wiring to connect to gates and form other connections in the CMOS APS cell 10.

Generally, in CMOS pixel cells, such as the CMOS APS cell 10 of FIGS. 1 and 2, incident light causes electrons to collect in n− region 14. An output signal produced by the source follower transistor having gate 27 is proportional to the number of electrons to be extracted from the n− region 14. The maximum output signal increases with increased electron capacitance or acceptability of the n− region 14 to acquire electrons. In this example, the p+/n− junction dominates the capacitance of the pinned photodiode 13. The characteristics of a p/n junction are well known.

At least approximately 30,000 electrons are needed to generate an adequate photosignal. Even as pixel size and, therefore, photodiode size, scale down, the number of electrons needed for an adequate photosignal remains the same. Decreasing the size of a conventional photodiode decreases its electron capacitance, leading to an inadequate photosignal. Accordingly, a pinned photodiode for use in a CMOS APS cell that permits decreased pixel size without decreasing electron capacity or increasing the pinning voltage is desired.

BRIEF SUMMARY OF THE INVENTION

The invention provides a pinned photodiode that has an increased electron capacitance without an increased pinning voltage, and a method for forming the same.

The invention provides a pinned photodiode structure comprising a substrate base over which is a first layer of semiconductor material. There is a base layer of a first conductivity type, wherein the base layer of a first conductivity type is the substrate base or is a doped layer over the substrate base. At least one doped region of a second conductivity type is below the surface of said first layer, and extends to form a first junction with the base layer. A doped surface layer of a first conductivity type is over the at least one region of a second conductivity type and forms a second photoconversion junction.

According to the invention, charge storage capacity for the photodiode is increased by extending the charge collection region thereof to the substrate base. These and other features of the invention will be more apparent from the following detailed description that is provided in connection with the accompanying drawings.

DETAILED DESCRIPTION OF THE INVENTION

In the following detailed description, reference is made to the accompanying drawings, which form a part hereof, to illustrate specific embodiments of the invention. These embodiments are described in sufficient detail to enable one of ordinary skill in the art to practice the invention. It is to be understood that other embodiments may be utilized, and that structural, logical, and electrical changes may be made without departing from the spirit and scope of the present invention.

The terms "wafer" and "substrate" denote a semiconductor-based material including silicon, silicon-on-insulator (SOI), silicon-on-sapphire (SOS) technology, doped and undoped semiconductors, epitaxial layers of silicon supported by a base semiconductor foundation, and other semiconductor structures. Also, a "wafer" or "substrate" may have been previously processed to form regions or junctions in or over the base semiconductor structure or foundation. Additionally, the semiconductor need not be silicon based. Instead it may be based on silicon-germanium, silicon-on-insulator, silicon-on-sapphire, germanium, gallium arsenide, or others. The term "substrate base" refers to a base semiconductor structure or foundation an epitaxial layer(s) and/or other semiconductor structures.

The term "pixel" refers to a picture element unit cell containing a photosensor and transistors for converting electromagnetic radiation into an electrical signal. Representative pixels and their formation are illustrated in the figures and description herein and the fabrication of all pixels in an imager typically will proceed simultaneously in a similar fashion.

Figure 3:
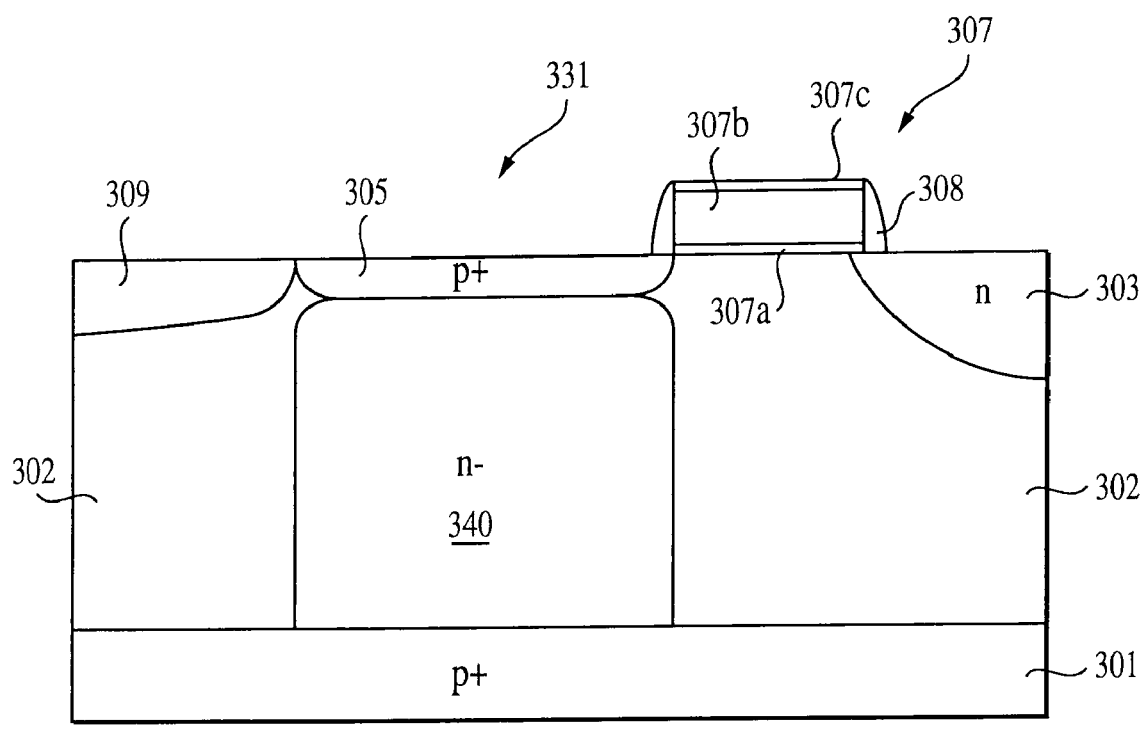
FIG. 3 is a cross-sectional view of a CMOS APS cell illustrating a pinned photodiode according to one embodiment of the invention.
Figure 6:
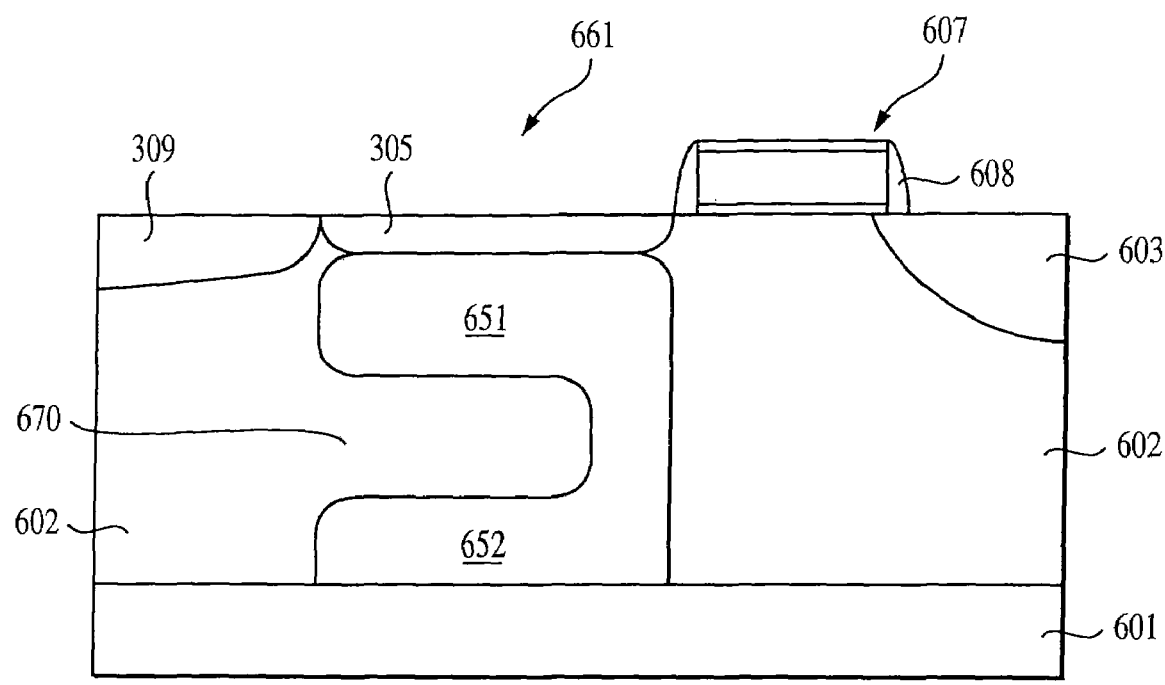
FIG. 6 is a cross-sectional view of a CMOS APS cell illustrating a pinned photodiode according to another embodiment of the invention.

In the drawings, like elements are designated by like reference numerals. FIG. 3 and FIG. 6 illustrate two exemplary embodiments of CMOS APS cells 330 (FIG. 3) and 660 (FIG. 6) having respective pinned photodiodes 331 and 661 constructed according to the invention.

The pinned photodiode 331 depicted in FIG. 3 includes an n− region 340 that is laterally displaced from the gate 307 of a transistor and extends from a p+ surface layer 305 to a p+ substrate base 301. The resultant pinned photodiode 331 has a p+ (surface)/n−/p+ (substrate) structure, including two p+/n− junctions.

Figure 1:
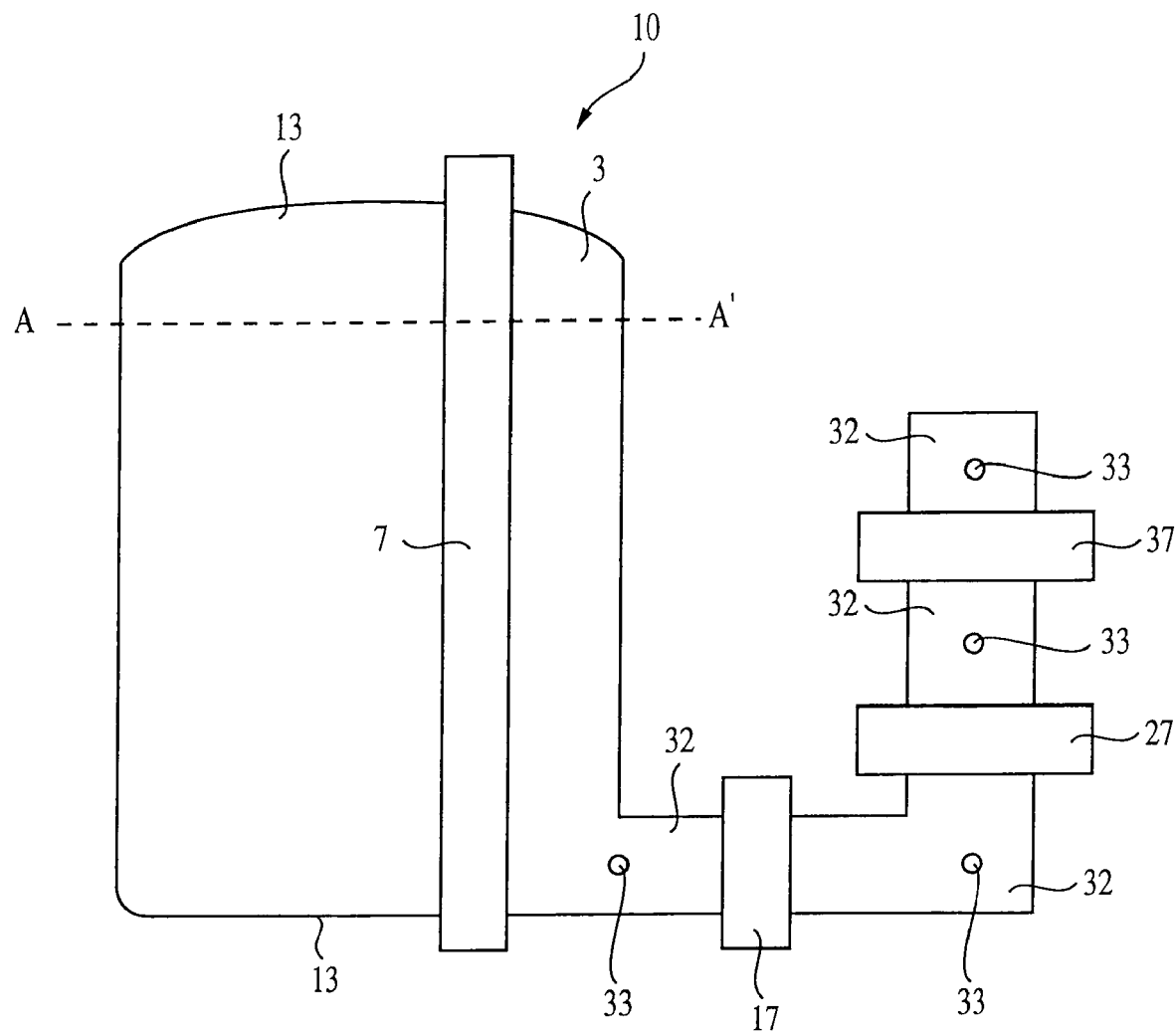
FIG. 1 is a top plan view of an exemplary CMOS APS cell.
Figure 2:
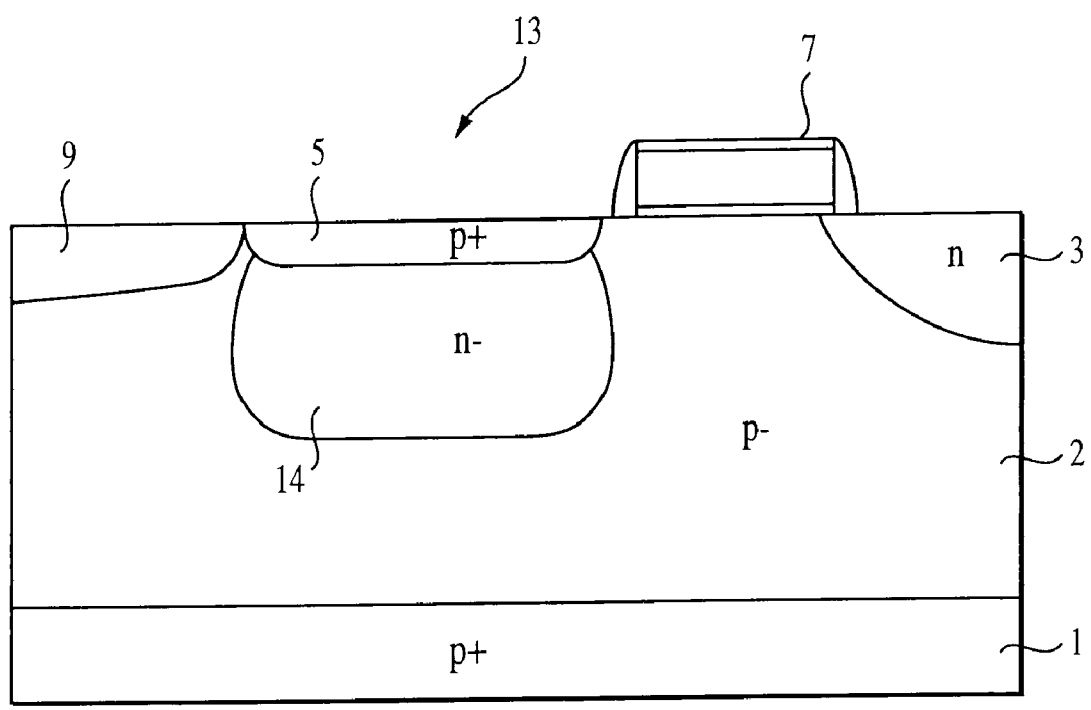
FIG. 2 is a cross-sectional view of the CMOS APS cell of FIG. 1 along line AA'.
Figure 4A:
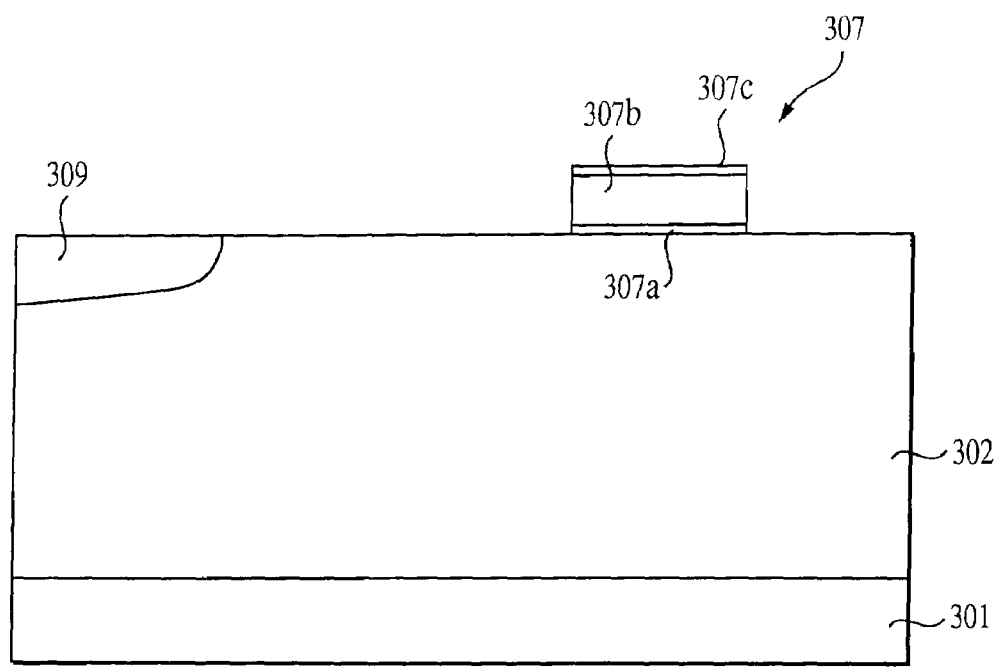
FIG. 4A is a cross-sectional view of a CMOS APS cell of FIG. 3 illustrating the fabrication of a pinned photodiode according to the first embodiment at an initial stage of the process.

The formation of the pinned photodiode 331 (FIG. 3) will be described with reference to FIGS. 4A-4D. FIG. 4A illustrates a wafer along a same cross-sectional view as shown in FIG. 2. There is a substrate base 301 of a first conductivity type. The substrate base 301 may be provided with the wafer. Instead of a substrate base 301 of a first conductivity type, there may be a base layer of a first conductivity type that is implanted beneath the photodiode 331 by conventional methods before or after the formation of photodiode 331. For simplicity, in this example, the substrate base 301 is provided with the wafer and is described prior to the formation of the photodiode 331. Preferably, the substrate base 301 is a highly doped p+ substrate base 301 having an active dopant concentration within the range of approximately $1\times10^{17}$ to $1\times10^{20}$ atoms per $cm^3$, and more specifically within the range of approximately $5\times10^{17}$ to $1\times10^{19}$ atoms per $cm^3$. Over the substrate base 301 a p-type epitaxial layer 302 is formed.

FIG. 4A also shows an isolation region 309. An isolation region 309 is formed within the epitaxial layer 302 and is filled with a dielectric material, which may include an oxide, such as SiO or $SiO_2$; oxynitride; a nitride, such as silicon nitride; silicon carbide; a high temperature polymer; or other suitable material. Preferably, as in this example, the isolation region is a shallow trench isolation (STI) region 309, formed by known STI processes.

Further illustrated in FIG. 4A is a gate 307 of a transfer transistor formed over the epitaxial layer 302. As shown in FIG. 4A, the gate 307 may be a multilayer transfer gate stack comprising a first insulating layer 307a of grown or deposited silicon oxide on the epitaxial layer 304, a conductive layer 307b of doped polysilicon or other suitable conductive material, and a second insulating layer 307c, which may be formed of an oxide ($SiO_2$), a nitride (silicon nitride), an oxynitride (silicon oxynitride), ON (oxide-nitride), NO (nitride-oxide), or ONO (oxide-nitride-oxide). The first and second insulating layers, 307a and 307c, and the conductive layer 307b may be formed by conventional deposition methods, such as chemical vapor deposition (CVD) or plasma chemical vapor deposition (PECVD), among others.

Also, a silicide layer (not shown) may be formed between the conductive layer 307b and the second insulating layer 307c. The silicide layer may be included in all of the transistor gate structures in an imager circuit and may be titanium silicide, tungsten silicide, cobalt silicide, molybdenum silicide, or tantalum silicide. This additional conductive layer may also be a barrier layer/refractor metal, such as TiN/W or $W/N_x/W$, or it could be formed entirely of $WN_x$.

Figure 4B:
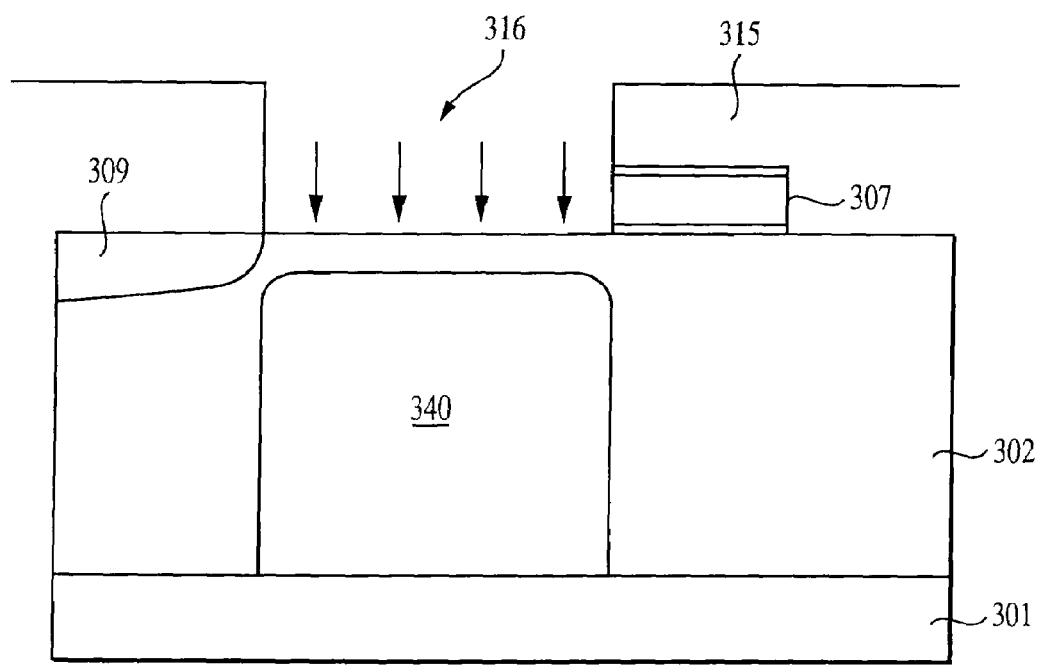
FIG. 4B is a cross-sectional view of a CMOS APS cell of FIG. 3 illustrating the fabrication of a pinned photodiode at a stage of the process subsequent to that shown in FIG. 4A.

Referring to FIG. 4B, after formation of the STI region 309 and gate 307, an implantation mask 315 is formed in a pattern over the wafer, providing an opening 316 to an area between an edge of the gate 307 and the STI region 309 where a charge accumulation region of a photodiode 331 is to be formed. The implantation mask 315 may be formed of photo resist according to techniques known in the art. As shown in FIG. 4B, on one side, the implantation mask 315 is approximately coincident with an edge of the gate 307. On the other side, the implantation mask 316 overlaps the STI region 309, but does not extend past an edge of the STI region 309 adjacent to where a charge accumulation region of a photodiode 331 is to be formed.

Next, a dopant of a second conductivity type is implanted through the opening 316 and into the epitaxial layer 302. Preferably, the dopant is n-type, such as phosphorus, arsenic or antimony. A lightly doped n− region 340 is implanted from a point below the surface of the epitaxial layer 302 continuing to the substrate base 301. Thereby, the n− region 340 and the substrate base 301 form an n−/p+ junction. Preferably, the n−/p+ (substrate base) junction is at a depth that is approximately at or above an absorption depth of red light.

It should be noted that if the substrate base 301 is instead a p+ base layer implanted before or after photodiode 331 is formed, the n-region 340 would form a junction the p+ base layer.

The n− region 340 is aligned with an edge of the gate 307 and forms a photosensitive charge storage region for collecting photo-generated electrons. Multiple implants may be used to tailor the profile of the n− region 340. Also, an angled implantation may also be conducted to form the n− region 340, such that implantation is carried out at angles other than 90 degrees relative to the surface of the epitaxial layer 302.

The active dopant concentration in the n− region 340 may be within the range of approximately $1\times10^{15}$ to $5\times10^{18}$ atoms per $cm^3$, and more specifically within the range of approximately $5\times10^{15}$ to $1\times10^{18}$ atoms per $cm^3$. The active dopant concentration in the n− region 340 may also be chosen depending on the dimensions of the n− region 340 to result in a desired pinned potential. If desired, the n− concentration may be dropped or increased to result in a lower or higher pinned potential, respectively.

Figure 4C:
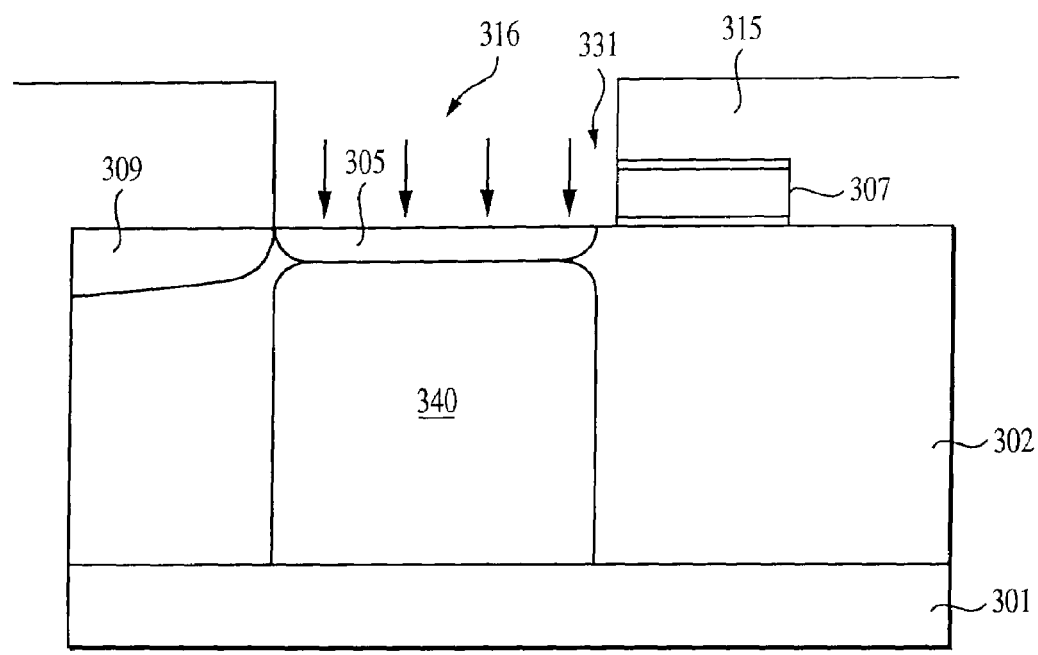
FIG. 4C is a cross-sectional view of a CMOS APS cell of FIG. 3 illustrating the fabrication of a pinned photodiode at a stage of the process subsequent to that shown in FIG. 4B.

Next, a dopant of a first conductivity type is implanted through the opening 316 into the epitaxial layer 302, as shown in FIG. 4C. Preferably, a p-type dopant, such as boron, beryllium, indium or magnesium, is used to form a highly doped p+ surface layer 305 over the n− region 340 and forming a junction with the n− region 340. Preferably, the active dopant concentration of the p+ surface layer 305 is within the range of approximately $1\times10^{17}$ to $1\times10^{20}$ atoms per $cm^3$, and more specifically within the range of approximately $5\times10^{17}$ to $1\times10^{19}$ atoms per $cm^3$. Subsequently, the implantation mask 315 is removed by conventional methods to complete the formation of the pinned photodiode 331.

The p+ surface layer 305 may also be formed by other known techniques. For example, the p+ surface layer 305 may be formed by a gas source plasma doping process, or by diffusing a p-type dopant into the epitaxial layer 302 from an in-situ doped layer or a doped oxide layer deposited over the area where photodiode 331 is to be formed.

Figure 4D:
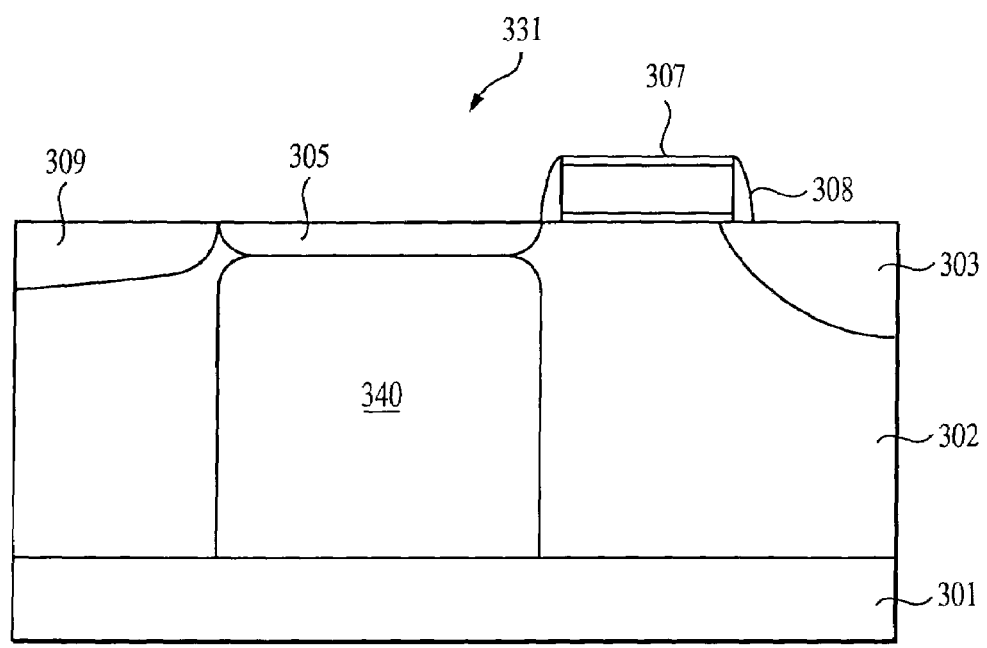
FIG. 4D is a cross-sectional view of a CMOS APS cell of FIG. 3 illustrating the fabrication of a pinned photodiode at a stage of the process subsequent to that shown in FIG. 4C.

As shown in FIG. 4D, a floating diffusion region 303 may then be formed by known methods as a doped region of n-type conductivity in the epitaxial layer 302 adjacent to the gate 307 and on an opposite side of the gate 307 from the photodiode 331. Sidewall spacers 308 may also be formed on the sidewall of the gate 307 by conventional methods.

Devices of a CMOS APS cell, including a reset transistor, a source follower transistor, and a row select transistor are formed by methods known in the art (not shown). Further processing may also be employed to form other conventional features of a CMOS APS cell.

Figure 5:
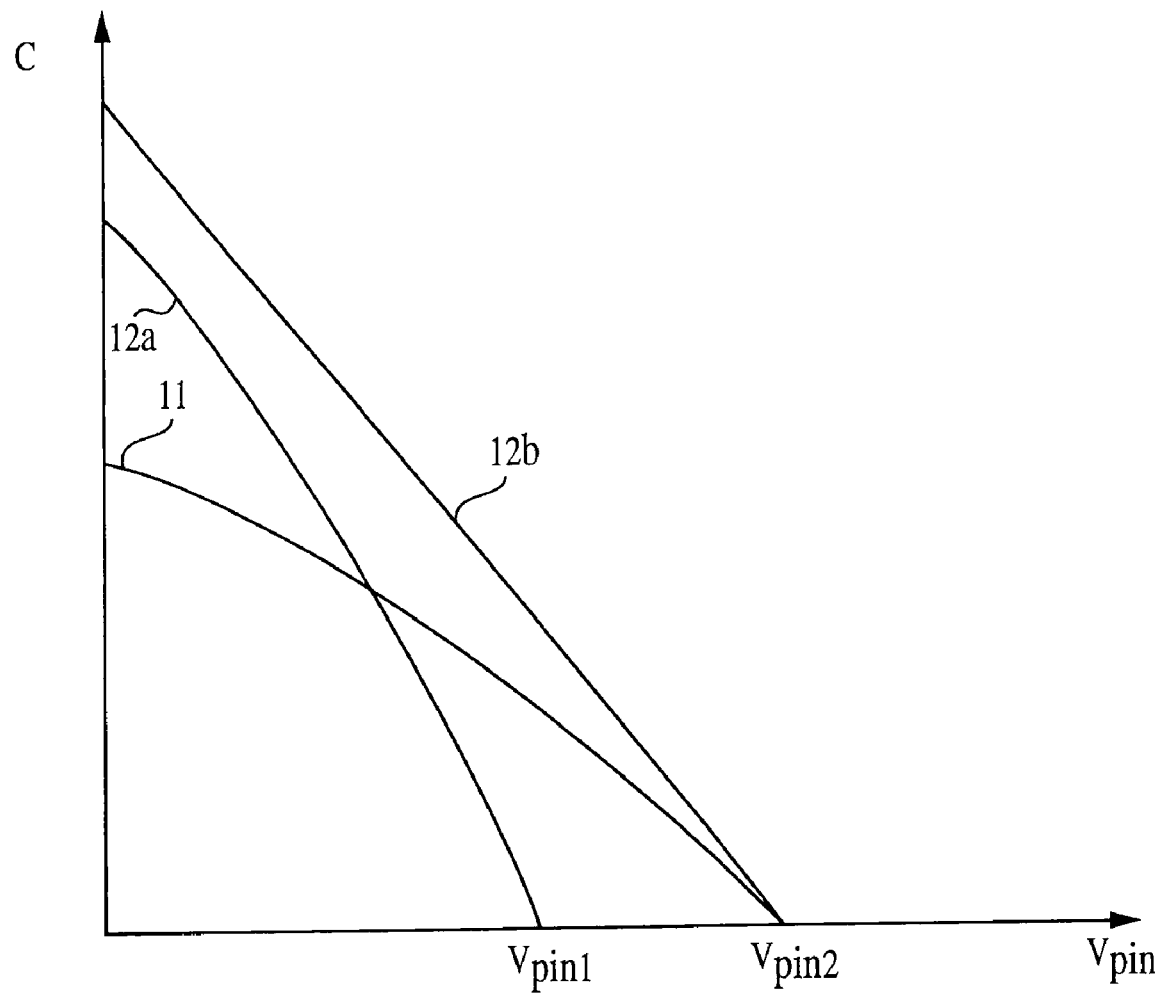
FIG. 5 is a graph representing the pinning voltage versus the capacitance of a conventional pinned photodiode and the capacitance of a photodiode according an embodiment of the invention.

The resultant pinned photodiode 331 has a p+ (surface)/ n−/p+ (substrate base) structure, with two p+/n− junctions because the n− region 340 extends to the substrate base 301. FIG. 5 illustrates the relationship between charge capacitance (C) and pinning voltage ($V_{pin}$) of the photodiode 331 (FIG. 3), represented by lines 12 and 12b, and a conventional photodiode 13 (FIG. 2), represented by line 11. For a same charge capacity, defined as the area under the C-V curve, the pinned voltage $V_{pin2}$ of photodiode 331, line 12a, is lower than the pinned voltage $V_{pin1}$ of a conventional photodiode 13, line 11. For a same pinned voltage $V_{pin2}$, the charge capacity of photodiode 331, line 12b, is higher than the charge capacity of conventional photodiode 13, line 11.

Additionally, the pinned photodiode 331 has an overall performance advantage over the conventional pinned photodiode 13 (FIG. 2) under certain conditions described below.

A pinned voltage, or pinned potential, is proportional to both the thickness and doping concentration of the n− region 340. Also, a pinned voltage is limited to a voltage below a CMOS imager operating voltage. Therefore, the n− region 340 doping concentration may be decreased to achieve a lower targeted pinned voltage. If, however, the n− region 340 doping concentration is decreased past an optimal range, the charge capacity advantage of the photodiode 331 is diminished.

Reducing photodiode dimensions leads to a decreased pinned voltage. Therefore, at a smaller size the pinned photodiode 331 will have higher n− region 340 doping concentration and higher capacitance at a same targeted pinned voltage. Thereby the photodiode 331 has a charge capacity advantage over conventional photodiode 13 is preserved.

As noted above in connection with FIG. 4B, preferably a depth of the n−/p+ (substrate base) junction of photodiode 331 is approximately at or above the absorption depth of red light. Such a placement of the n−/p+ (substrate base) junction prevents photodiode response and Quantum Efficiency degradation for red light. The absorption depth of red light is chosen because it is higher/deeper than the absorption depths of either green or blue wavelength light. For a smaller/shallower red light absorption depth, the n− region 340 doping concentration can be higher for a same pinned voltage, preserving the charge capacity advantage of photodiode 331 over conventional photodiode 13 is preserved.

Therefore, the pinned photodiode of embodiment 331 is effective at very small photodiode dimensions, 1 micron×1 micron and below; for semiconductor materials having a higher absorption coefficient than silicon in the visible wavelength range, such as silicon-germanium alloy or semiconductors of III-V material system; and/or when some quantum efficiency loss is acceptable.

In addition to increased charge capacity, this embodiment may reduce dark current and cross-talk. Dark current should be reduced because to achieve a same electron storage capacity, photodiode 331 will make better use of the pixel volume it occupies and, therefore, may have a lower n− concentration. In an abrupt p+/n− junction, the lower doped side will determine the junction leakage. Also, cross-talk may be prevented because the n− region 340 extends to the substrate base collecting electrons in an area closer to the substrate base 301, which in a conventional photodiode, may diffuse into another pixel.

FIG. 6 depicts a more complex second embodiment of a pinned photodiode 661 in accordance with the invention. Photodiode 661 is located between a gate 607 of a transfer transistor and a STI region 609, and includes an intermediate p− region 670 partially separating a surface n− region 651 and a base n− region 652, which remain connected along edges thereof. The surface n− region 651 forms a junction with a p+ surface layer 605, and the base n− region 652 forms a junction with the p+ substrate base 601.

Figure 7A:
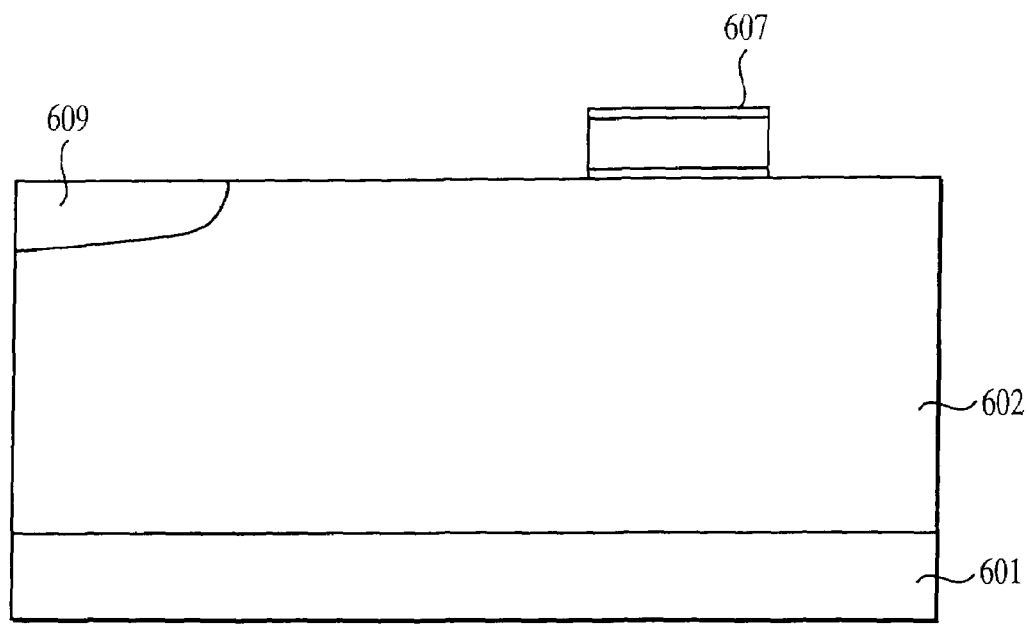
FIG. 7A is a cross-sectional view of a CMOS APS cell of FIG. 6 illustrating the fabrication of a pinned photodiode at an initial stage of the process.

Formation of the pinned photodiode 661 will be described with reference to FIGS. 7A-7E. Referring to FIG. 7A, a substrate base 601 of a first conductivity type is provided. The substrate base 601 may be provided with the wafer. Instead of a substrate base 601 of a first conductivity type, there may be a base layer of a first conductivity type that is implanted beneath the photodiode 661 by conventional methods before or after the formation of photodiode 661. For simplicity, in this example, the substrate base 601 is provided with the wafer and is described prior to the formation of the photodiode 661. Preferably, the substrate base 601 is a highly doped p+ substrate base 601 having an active dopant concentration within the range of approximately $1 \times 10^{17}$ to $1 \times 10^{20}$ atoms per cm$^3$, and more specifically within the range of approximately $5 \times 10^{17}$ to $1 \times 10^{19}$ atoms per cm$^3$.

A p-type epitaxial layer 602 is grown over the substrate base 601. FIG. 7A also illustrates a STI region 609 and a gate 607, which may be formed as described in connection with FIG. 4A above.

Figure 7B:
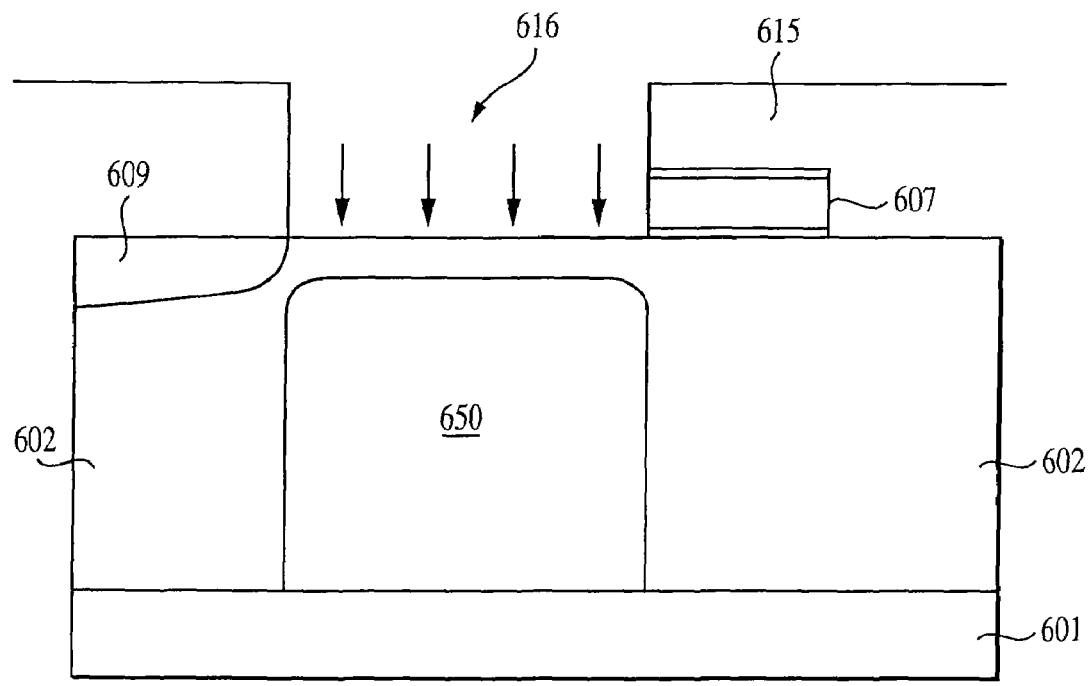
FIG. 7B is a cross-sectional view of a CMOS APS cell of FIG. 6 illustrating the fabrication of a pinned photodiode at a stage of the process subsequent to that shown in FIG. 7A.

Referring to FIG. 7B, after formation of the STI region 609 and gate 607, a first implantation mask 615 is formed over the wafer according to techniques known in the art. The first implantation mask 615 is patterned to provide an opening 616 to an area between an edge of the gate 607 and the STI region 609 where a charge accumulation region of a pinned photodiode 661 is to be formed. The first implantation mask 615 may be formed of photo resist. As shown in FIG. 7B, on one side, the first implantation mask 615 is approximately coincident with the edge of the gate 607. On the other side, the first implantation mask 615 overlaps the STI region 609, but does not extend past an edge of the STI region 609 adjacent to where a charge accumulation region of a photodiode 661 is to be formed.

Next, a dopant of a second conductivity type is implanted through the opening 616 into the epitaxial layer 602. Preferably, the dopant is n-type, such as phosphorus, arsenic or antimony. A lightly doped n− region 650 is implanted from a point below the surface of the epitaxial layer 602 continuing to the substrate base 601. Thereby, the n− region 650 and the substrate base 601 form an n−/p+ junction. Preferably, the n−/p+ (substrate base) junction is at a depth that is approximately at or above an absorption depth of red light.

It should be noted that if the substrate base 601 is instead a p+ base layer implanted before or after photodiode 661 is formed, the n-region 650 would form a junction the p+ base layer.

The n− region 650 is aligned with an edge of the gate 607 and forms a photosensitive charge storage region for collecting photo-generated electrons. The active dopant concentration in the n− region 650 may be within the range of approximately $1 \times 10^{15}$ to $5 \times 10^{18}$ atoms per cm$^3$, and more specifically within the range of approximately $5 \times 10^{15}$ to $1 \times 10^{18}$ atoms per cm$^3$. Multiple implants may be used to tailor the profile of the n− region 650. Also, an angled implantation may also be conducted to form the n− region 650, such that implantation is carried out at angles other than 90 degrees relative to the surface of the epitaxial layer 602. The first implantation mask 615 is then removed by conventional methods.

Figure 7C:
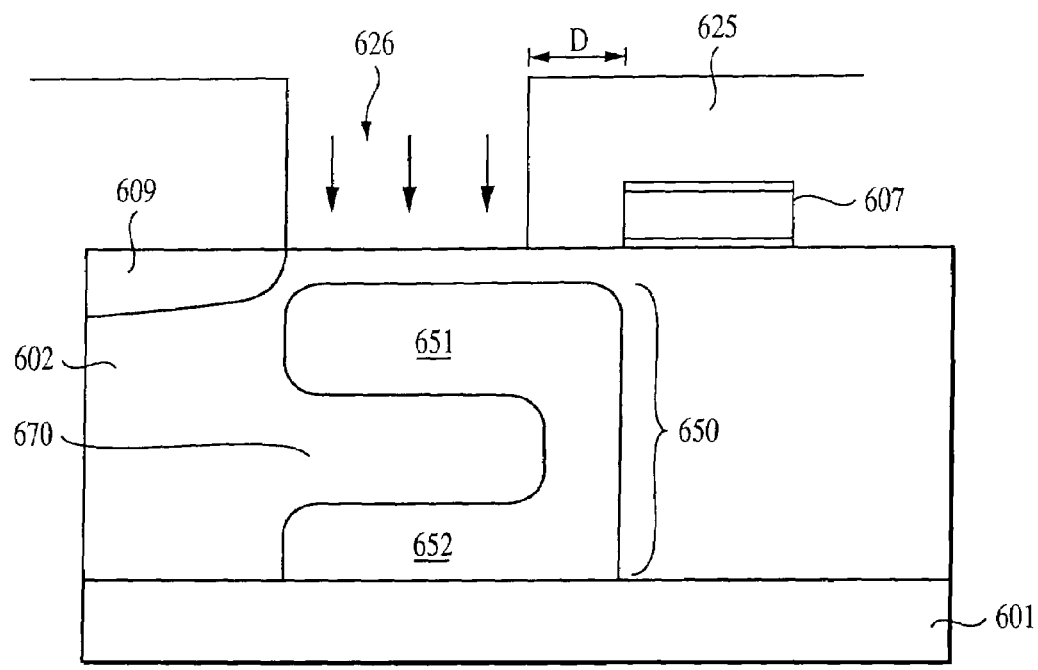
FIG. 7C is a cross-sectional view of a CMOS APS cell of FIG. 6 illustrating the fabrication of a pinned photodiode at a stage of the process subsequent to that shown in FIG. 7B.

Referring to FIG. 7C, a second implantation mask 625 is formed over the wafer by conventional methods and patterned to have an opening 626 over the n− region 650. The second implantation mask 625 may also be a layer of photo resist. On one side, the second implantation mask 625 overlaps the STI region 609, but does not extend over the photodiode area. On the other side the second implantation mask 625 extends a distance D past an edge of gate 607 over a portion of the n-region 650.

Thereafter, an intermediate portion of the n− region 650 is counter doped by implanting a dopant of a first conductivity type. Preferably, the dopant is a p-type dopant, such as boron, beryllium, indium or magnesium. As shown in FIG. 7C, a lightly doped intermediate p− region 670 is formed in the n− region 650 such that it meets a p-type portion of the epitaxial layer 602 on a lateral edge thereof. In this embodiment, the intermediate p− region 670 meets a p-type portion of the epitaxial layer 602 on a lateral edge thereof adjacent to the STI region 609. Multiple implants may be used to tailor the profile of the intermediate p− region 670. Also, an angled implantation may also be conducted to form the intermediate p− region 670, such that implantation is carried out at angles other than 90 degrees relative to the surface of the epitaxial layer 602.

The active dopant concentration of the intermediate p− region 670 may be within the range of approximately $1 \times 10^{15}$ to $5 \times 10^{17}$ atoms per cm$^3$, and more specifically within the range of approximately $5 \times 10^{15}$ and $1 \times 10^{17}$ atoms per cm$^3$. Also, the intermediate p− region may instead be a highly doped intermediate p+ region having an active dopant concentration similar to that of the substrate base 601 and the surface p+ region 605. In such a case, the active dopant concentration of the intermediate p+ region 670 may be within the range of approximately $1 \times 10^{17}$ to $1 \times 10^{20}$ atoms per cm$^3$, and more specifically within the range of approximately $5 \times 10^{17}$ to $1 \times 10^{19}$ atoms per cm$^3$.

The formation of the intermediate p− region 670 also forms two n− regions: a surface n− region 651 and a base n− region 652, which are partially separated by the intermediate p− region 670. The two n-regions 651 and 652 remain connected along at least one edge thereof. Preferably, the n− regions 651 and 652 are connected along at least one edge thereof on a side aligned with the gate 607, causing the n− regions 651 and 652, considered as a whole, to have a reverse C-shape as viewed from the perspective shown in FIG. 6. Subsequently, the second implantation mask 625 is removed using conventional techniques.

As noted above, the active dopant concentration in the n-region 650 (FIG. 7B) may be within the range of approximately $1 \times 10^{15}$ to $5 \times 10^{18}$ atoms per cm$^3$, and more specifically within the range of approximately $5 \times 10^{15}$ to $1 \times 10^{18}$ atoms per $cm^3$. The active dopant concentration in the n– region 650 may also be chosen depending on the dimensions of the n– regions 651 and 652 to result in a desired pinned potential. If desired, the n– concentration may be dropped or increased to result in a lower or higher pinned potential, respectively.

Figure 7D:
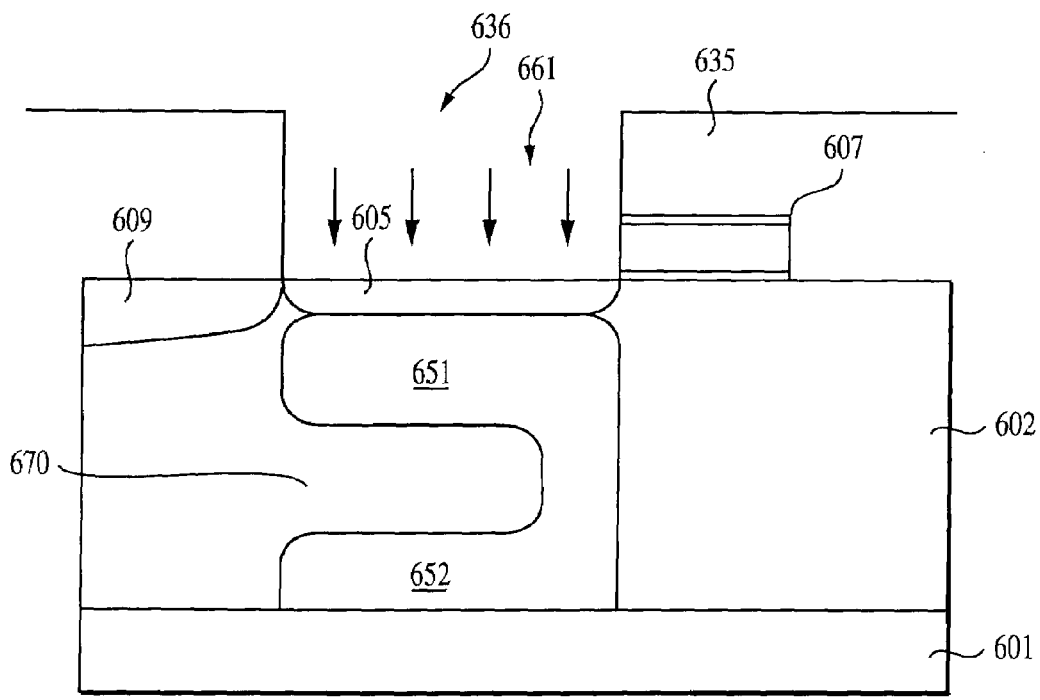
FIG. 7D is a cross-sectional view of a CMOS APS cell of FIG. 6 illustrating the fabrication of a pinned photodiode at a stage of the process subsequent to that shown in FIG. 7C.

Referring to FIG. 7D, next, a third implantation mask 635 is formed over the wafer by conventional methods and is patterned to form an opening 636 that is similar to that of the opening 616 of the first implantation mask 615 (FIG. 7B). The third implantation mask 635 may also be a layer of photo resist. Then, a dopant of a first conductivity type is implanted through the opening 636 into the epitaxial layer 602. Preferably the dopant is a p-type dopant such as boron, beryllium, indium or magnesium, and a highly doped p+ surface layer 605 is formed over the n– region 651, such that the p+ surface layer 605 forms a junction with the surface n– region 651.

Preferably, the active dopant concentration of the p+ surface layer 605 is within the range of approximately $1 \times 10^{17}$ to $1 \times 10^{20}$ atoms per $cm^3$, and more specifically within the range of approximately $5 \times 10^{17}$ to $1 \times 10^{19}$ atoms per $cm^3$. The p+ surface layer 605 may also be formed by other known techniques. For example, the p+ surface layer 605 may be formed by a gas source plasma doping process, or by diffusing a p-type dopant into the epitaxial layer 302 from an in-situ doped layer or a doped oxide layer deposited over the area where the photodiode 661 is to be formed.

Figure 7E:
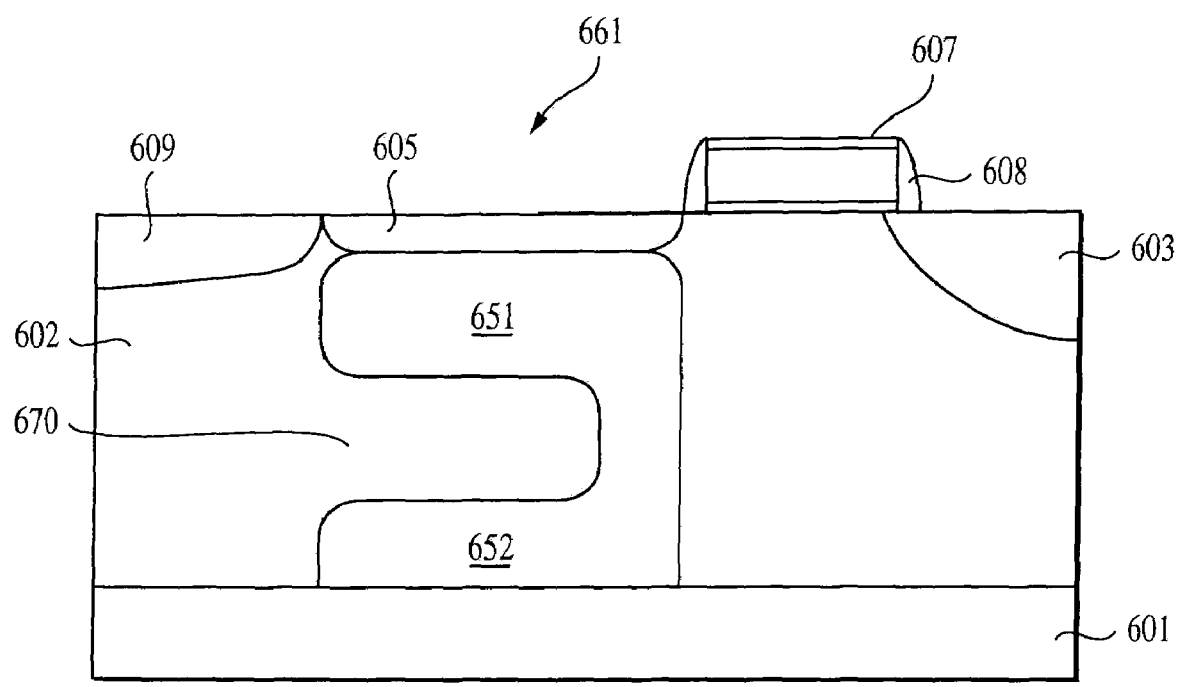
FIG. 7E is a cross-sectional view of a CMOS APS cell of FIG. 6 illustrating the fabrication of a pinned photodiode at a stage of the process subsequent to that shown in FIG. 7D.

As shown in FIG. 7E, a floating diffusion region 603 may then be formed by known methods as a doped region of n-type conductivity in the epitaxial layer 602 adjacent to the gate 607 and on an opposite side of the gate 607 from the photodiode 661. Sidewall spacers 608 may also be formed on the sidewall of the gate 607 by conventional methods.

Devices of a CMOS APS cell, including a reset transistor, a source follower transistor, and a row select transistor are formed by methods known in the art (not shown). Further processing may also be employed to form other conventional features of a CMOS APS cell.

Figure 8:
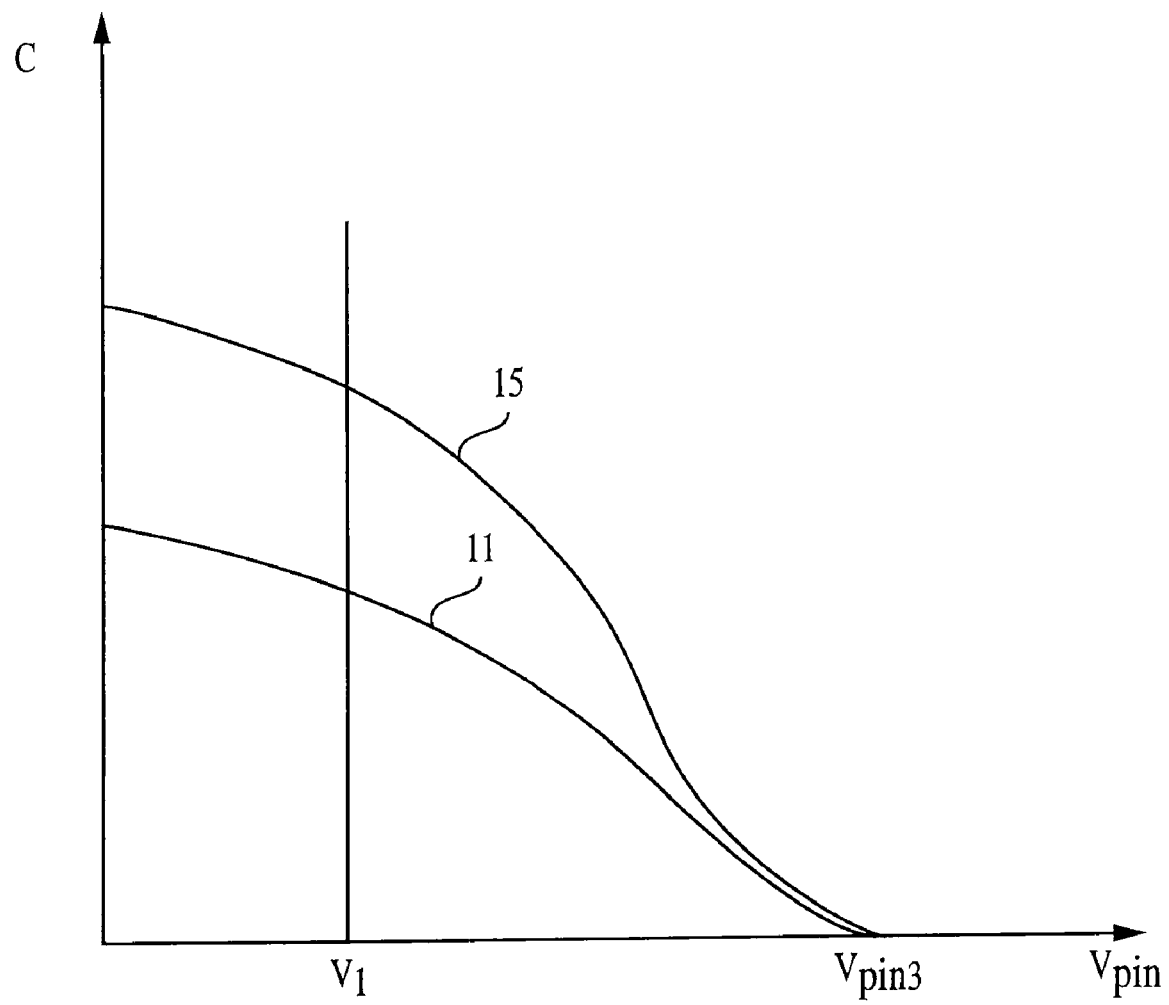
FIG. 8 is a graph representing the pinning voltage versus the capacitance of a conventional pinned photodiode and the capacitance of a photodiode according to another embodiment of the invention.

The resultant pinned photodiode 661 includes two high capacitance p+/n– junctions and has approximately double the capacitance of the conventional pinned photodiode 13 (FIG. 2). FIG. 8 illustrates the relationship between charge capacitance (C) and pinning voltage ($V_{pin}$) of the photodiode 661 (FIG. 6), represented by line 15, and a conventional photodiode 13 (FIG. 2), represented by line 11. At a same voltage $V_1$, the capacitance of the photodiode 661 is approximately double that of the photodiode 13 of the prior art below a pinned voltage $V_{pin3}$. Therefore, the charge capacity, defined as the area under the C-V curve, of photodiode 661 is higher than the charge capacity of conventional photodiode 13. Accordingly, the photodiode 661 can provide an adequate photosignal at a smaller size than a conventional photodiode 13.

Preferably, the pinned potentials of the two n– regions 651 and 652 will be similar to avoid image lag. Additionally, the surface n– region 651 may have a $V_{pin}$ higher than that of the base n– region 652 to ensure complete charge transfer and avoid image lag. In addition to increased charge capacity, this embodiment may provide reduced cross-talk because the n– region 652 extends to the substrate base, better preventing electrons from diffusing from one pixel to another.

Although the invention is described as being formed using a p– epitaxial layer over a p+ substrate, it may also be formed using an n– epitaxial layer over a p+ substrate. As known in the art, acceptor regions would be implanted where the potential barrier to electrons would be formed, and n-wells and p-wells would be implanted where MOS transistors would be formed.

Also, while the above embodiments are described in connection with the formation of pnp-type photodiodes the invention is not limited to these embodiments. The invention also has applicability to photodiodes formed from npn regions in a substrate. The dopant and conductivity types of all structures would change accordingly, with the transfer gate being part of a PMOS transistor, rather than an NMOS transistor as in the embodiments described above.

In addition, although the invention is described in connection with a four-transistor (4T) pixel cell employing a transfer transistor having a transfer gate 307, 607, the invention may also be incorporated into a three-transistor (3T) cell, or into a five-transistor (5T) cell. A 3T cell differs from the 4T cell by the omission of the charge transfer transistor and associated gate 307, 607, and the coupling of the n regions of the photodiode and the floating diffusion regions through an overlap of the two or an n region bridging the two, which is well known in the art. A 5T cell differs from the 4T cell by the addition of a shutter transistor or a CMOS photo gate transistor.

Figure 9:
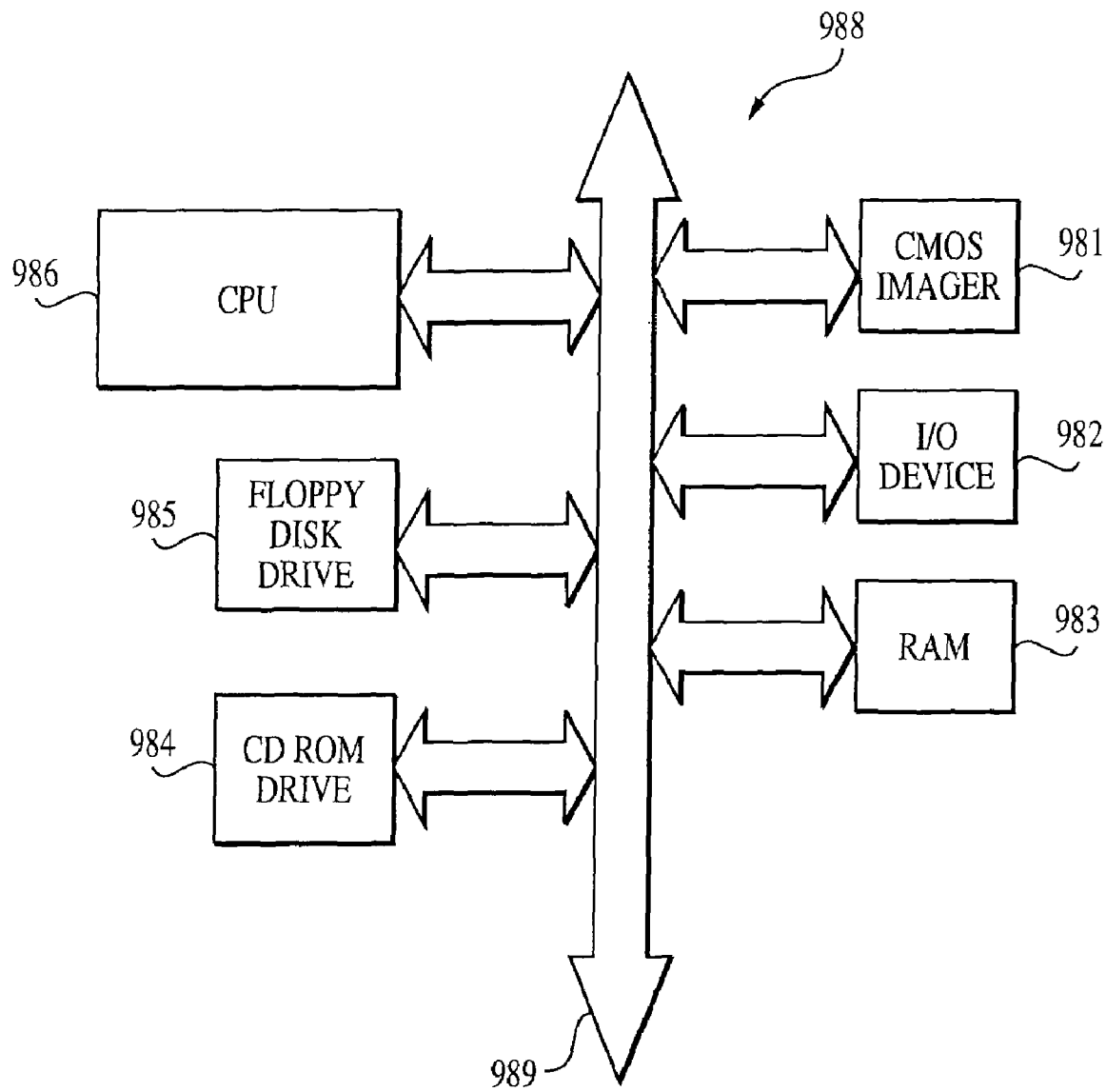
FIG. 9 illustrates a schematic diagram of a computer processor system incorporating a CMOS imager device containing one or more pixel cells according to the present invention.

A typical processor-based system 988 including a CMOS imager device 981 having an array of pixels, which includes pixels according to the embodiments of the present invention, is illustrated generally in FIG. 9. A processor-based system 988 is exemplary of a system having digital circuits that could include CMOS imager devices. Without being limiting, such a system could include a computer system, camera system, scanner, machine vision, vehicle navigation, video phone, surveillance system, auto focus system, star tracker system, motion detection system, image stabilization system, and data compression system.

A processor-based system, for example a computer system, generally comprises a central processing unit (CPU) 986, such as a microprocessor, that communicates with an input/output (I/O) device 982 over a bus 989. The CMOS imager 981, which produces an image output from a pixel array, also communicates with the system 988 over bus 989. The processor-based system 988 also includes random access memory (RAM) 983, and may include peripheral devices, such as a floppy disk drive 984 and a compact disk (CD) ROM drive 984, which also communicate with CPU 986 over the bus 989. The CMOS imager 981 may be combined with a processor; such as a CPU, digital signal processor, or microprocessor; with or without memory storage on a single integrated circuit or on a different chip than the processor.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method of forming a diode, the method comprising the acts of:
   forming an epitaxial layer of a first conductivity type over a substrate, the substrate being of the first conductivity type and having a higher active dopant concentration than the epitaxial layer;
   forming a first doped region of a second conductivity type within the epitaxial layer such that the first doped region forms a first junction with the substrate;

forming a second doped region by implanting a dopant of the first conductivity type within the first doped region, such that the second doped region meets a portion of the epitaxial layer at a lateral edge thereof and such that the second doped region forms second and third junctions with the first doped region; and forming a third doped region of the first conductivity type within the epitaxial layer and above the first doped region such that the third doped region forms a fourth junction with a top surface of the first doped region.

2. The method of claim 1, wherein the first and second conductivity types are p and n, respectively.

3. The method of claim 1, wherein the act of forming the diode comprises forming a photodiode.

4. The method of claim 1, wherein the substrate comprises a p+region, wherein the act of forming the first doped region is an n− region, and wherein the third doped region is a p+ region.

5. The method of claim 1, wherein the substrate has an active dopant concentration within the range of approximately $1 \times 10^{17}$ to approximately $1 \times 10^{20}$ atoms per $cm^3$.

6. The method of claim 1, wherein the first doped region has an active dopant concentration within the range of approximately $1 \times 10^{15}$ to approximately $5 \times 10^{18}$ atoms per $cm^3$.

7. The method of claim 1, wherein the second doped region has an active dopant concentration within the range of approximately $1 \times 10^{15}$ to approximately $5 \times 10^{18}$ atoms per $cm^3$.

8. The method of claim 1, wherein the second doped region has an active dopant concentration that is substantially the same as the active dopant concentration of the substrate.

9. The method of claim 1, wherein the second doped region has an active dopant concentration within the range of approximately $1 \times 10^{17}$ to approximately $1 \times 10^{20}$ atoms per $cm^3$.

10. The method of claim 1, wherein the third doped region has an active dopant concentration within the range of approximately $1 \times 10^{17}$ to approximately $1 \times 10^{20}$ atoms per $cm^3$.

11. The method of claim 1, wherein the first junction is at a depth approximately at or above an absorption depth of red light.

12. The method of claim 1, wherein the second doped region partially separates two portions of the first doped region, wherein the two portions are vertically spaced within the epitaxial layer and connected along an edge of the first doped region.

13. A method of forming a photodiode, the method comprising the acts of:
forming a p-type epitaxial layer over a substrate, the substrate being p-type and having a higher active dopant concentration than the p-type epitaxial layer;
forming a first doped n-type region within the p-type epitaxial layer such that the first doped n-type region forms a first junction with the substrate;
forming a second doped p-type region by implanting a p-type dopant within the first doped n-type region, such that the second doped p-type region meets a portion of the p-type epitaxial layer at a lateral edge thereof and such that the second doped p-type region forms second and third junctions with the first doped n-type region; and
forming a third doped p-type region within the p-type epitaxial layer and above the first n-type doped region such that the third p-type doped region forms a fourth junction with a top surface of the first n-type doped region.

14. The method of claim 13, wherein the first junction is at a depth approximately at or above an absorption depth of red light.

15. The method of claim 13, wherein the second p-type doped region partially separates two portions of the first n-type doped region, wherein the two portions are vertically spaced within the p-type epitaxial layer and connected along an edge of the first n-type doped region.

16. A method of forming a pixel cell, comprising:
forming an epitaxial layer of a first conductivity type over a substrate, the substrate being of the first conductivity type and having a higher active dopant concentration than the epitaxial layer;
forming a gate of a transistor over the epitaxial layer;
forming an isolation region in the substrate; and
forming a pinned photodiode adjacent to the isolation region, the act of forming the photodiode comprising:
forming a first doped region of a second conductivity type within the epitaxial layer such that the first doped region forms a first junction with the substrate;
forming a second doped region by implanting a dopant of the first conductivity type within the first doped region, such that the second doped region meets a portion of the epitaxial layer at a lateral edge thereof and such that the second doped region forms second and third junctions with the first doped region; and
forming a third doped region of the first conductivity type within the epitaxial layer and above the first doped region such that the third doped region forms a fourth junction with a top surface of the first doped region.

17. The method of claim 16, wherein the first and second conductivity types are p and n, respectively.

18. The method of claim 16, wherein the substrate comprises a p+ region, wherein the act of forming the first doped region is an n− region, and wherein the third doped region is a p+ region.

19. The method of claim 16, wherein the substrate has an active dopant concentration within the range of approximately $1 \times 10^{17}$ to approximately $1 \times 10^{20}$ atoms per $cm^3$.

20. The method of claim 16, wherein the first doped region has an active dopant concentration within the range of approximately $1 \times 10^{15}$ to approximately $5 \times 10^{18}$ atoms per $cm^3$.

21. The method of claim 16, wherein the second doped region has an active dopant concentration within the range of approximately $1 \times 10^{15}$ to approximately $5 \times 10^{18}$ atoms per $cm^3$.

22. The method of claim 16, wherein the second doped region has an active dopant concentration that is substantially the same as the active dopant concentration of the substrate.

23. The method of claim 16, wherein the second doped region has an active dopant concentration within the range of approximately $1 \times 10^{17}$ to approximately $1 \times 10^{20}$ atoms per $cm^3$.

24. The method of claim 16, wherein the third doped region has an active dopant concentration within the range of approximately $1 \times 10^{17}$ to approximately $1 \times 10^{20}$ atoms per $cm^3$.

25. The method of claim 16, wherein the first junction is at a depth approximately at or above an absorption depth of red light.

26. The method of claim 16, wherein the second doped region partially separates two portions of the first doped region, wherein the two portions are vertically spaced within the epitaxial layer and connected along an edge of the first doped region.

* * * * *